United States Patent [19]

Fandrich et al.

[11] Patent Number: 5,463,757
[45] Date of Patent: Oct. 31, 1995

[54] COMMAND INTERFACE BETWEEN USER COMMANDS AND A MEMORY DEVICE

[75] Inventors: Mickey L. Fandrich, Placerville; Kelvin W. Lee, Sacramento; Jerry A. Kreiffels, Citrus Heights; Virgil N. Kynett, El Dorado Hills; Kurt B. Robinson, Newcastle, all of Calif.

[73] Assignee: Intel Corporation, Santa Clara, Calif.

[21] Appl. No.: 185,449

[22] Filed: Jan. 21, 1994

Related U.S. Application Data

[63] Continuation of Ser. No. 655,643, Feb. 11, 1991, abandoned.

[51] Int. Cl.⁶ .................................................. G06F 12/00
[52] U.S. Cl. .................... 395/430; 364/DIG. 1; 364/249.8; 364/246.6
[58] Field of Search ........................... 395/400, 425, 395/575

[56] References Cited

U.S. PATENT DOCUMENTS 4,875,156  10/1989  Tanagawa et al. ............... 395/375
5,222,046  6/1993  Kreifels et al. .................. 395/425

OTHER PUBLICATIONS

Mano, Morris, *Digital Logic and Computer Design*, Prentice–Hall, Inc., 1979 pp. 217–230.
Intel Memory Products Databook, 1991, pp. 6–55, 6–56, 6–60 through 6–66.

*Primary Examiner*—Rebecca L. Rudolph
*Attorney, Agent, or Firm*—Blakely, Sokoloff, Taylor & Zafman

[57] ABSTRACT

A command state machine for control circuitry associated with a memory array which control circuitry includes apparatus for programming and erasing the memory array including first state machine logic apparatus for providing control signals for reading the memory array and for initiating operations of the apparatus for programming and erasing the memory array in response to commands, and second state machine logic apparatus for controlling information derived from the memory array, the first and second state machine logic apparatus being adapted to assume predetermined states in response to any invalid command which have no adverse affect on the memory array or the control circuitry.

11 Claims, 6 Drawing Sheets

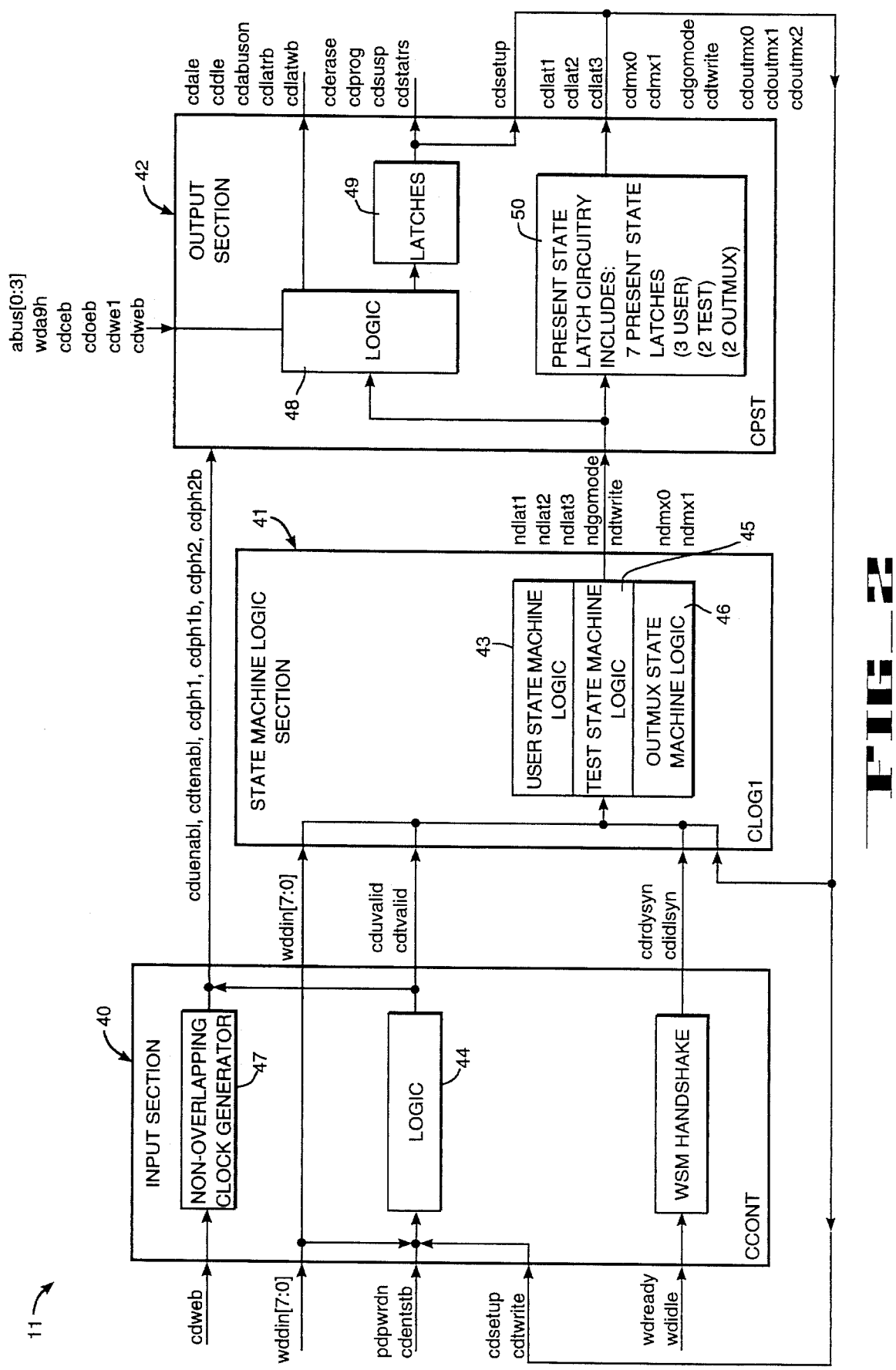
FIG_2

STATES OF STATE MACHINE LOGIC SECTION 41

| | INTERNAL STATES | | | OUTPUTS TO OTHER STATE MACHINES | | | | |
|---|---|---|---|---|---|---|---|---|
| STATE NAMES OF THE STATES OF USER STATE MACHINE LOGIC 43 | NDLAT1 | NDLAT2 | NDLAT3 | CDERASE | CDPROG | CDSTATRS | CDSUSP | CDSETUP |
| NORMAL READ | 0 | 0 | 0 | 0 | 0 | 0 | 0 | 0 |
| STATUS CLEAR | 0 | 0 | 1 | 0 | 0 | 1 | 0 | 0 |
| PROGRAM SETUP | 0 | 1 | 0 | 0 | 0 | 0 | 0 | 1 |
| PROGRAM ACTIVE | 0 | 1 | 1 | 0 | 1 | 0 | 0 | 0 |
| ERASE SETUP | 1 | 0 | 0 | 0 | 0 | 0 | 0 | 1 |
| ERASE ACTIVE | 1 | 0 | 1 | 1 | 0 | 0 | 0 | 0 |
| ERASE SUSP | 1 | 1 | 0 | 1 | 0 | 0 | 1 | 0 |
| ERASE BOTCHED | 1 | 1 | 1 | 1 | 1 | 0 | 0 | 0 |
| STATE NAMES OF THE STATES OF OUTMUX STATE MACHINE LOGIC 46 | CDOUTMX1 | CDOUTMX0 | CDOUTMX2 | | | | | |
| ARRAY | 0 | 0 | X | | | | | |
| SIG | 0 | 1 | X | | | | | |
| STATUS | 1 | 0 | X | | | | | |
| RBUS OR DATA LATCH | 1 | 1 | 0 — RBUS (ABUS ! = F) | | | | | |
| | 1 | 1 | 1 — DATA LATCH (ABUS = F) | | | | | |
| STATE NAMES OF THE STATES OF TEST STATE MACHINE LOGIC 45 | CDGOMODE | CDTWRITE | | | | | | |
| NOGO | 0 | 0 | | | | | | |
| TEST WRITE SETUP NOGO | 0 | 1 | | | | | | |
| GO | 1 | 0 | | | | | | |
| TEST WRITE SETUPGO | 1 | 1 | | | | | | |

FIG_3

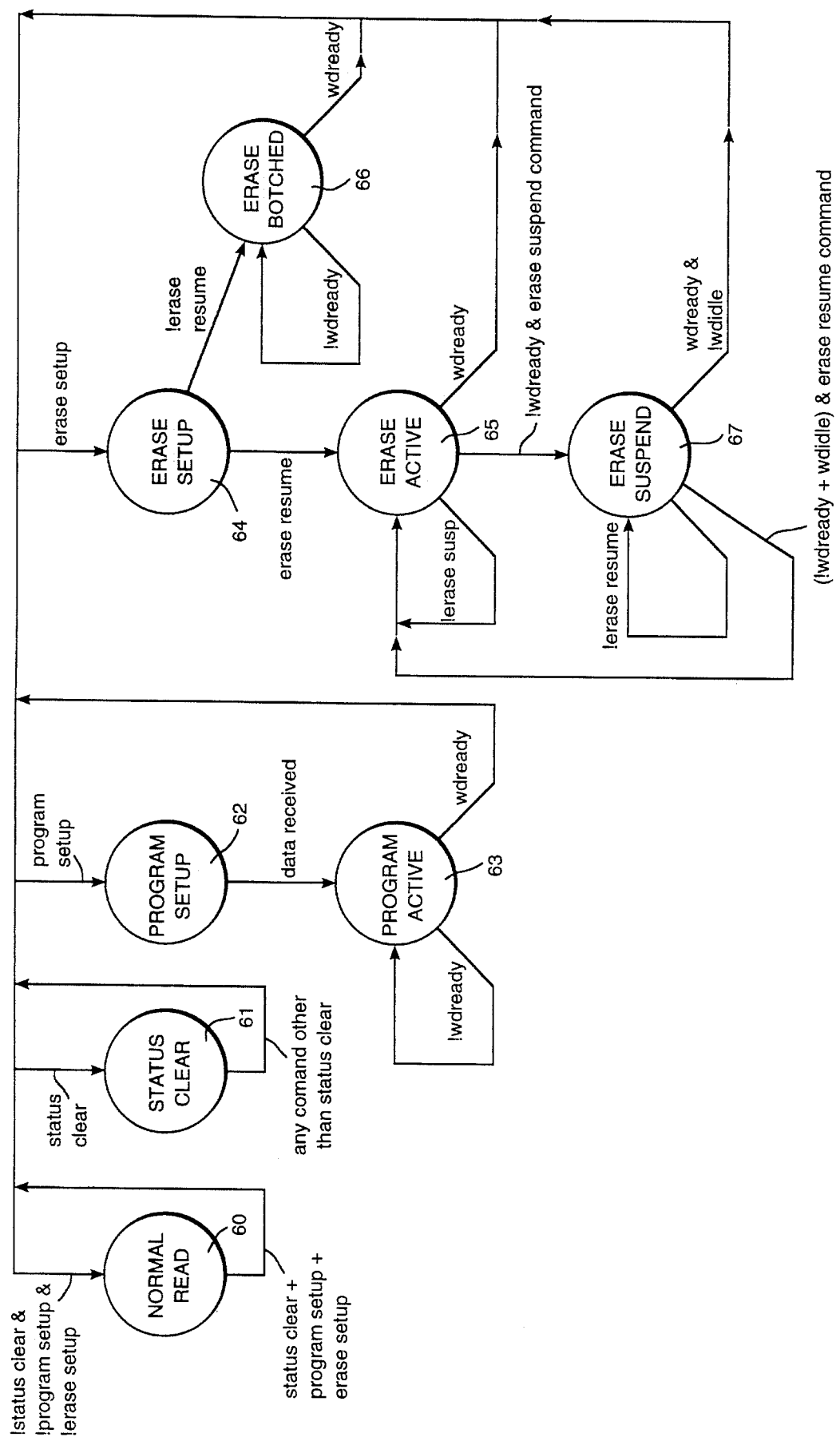
FIG_4

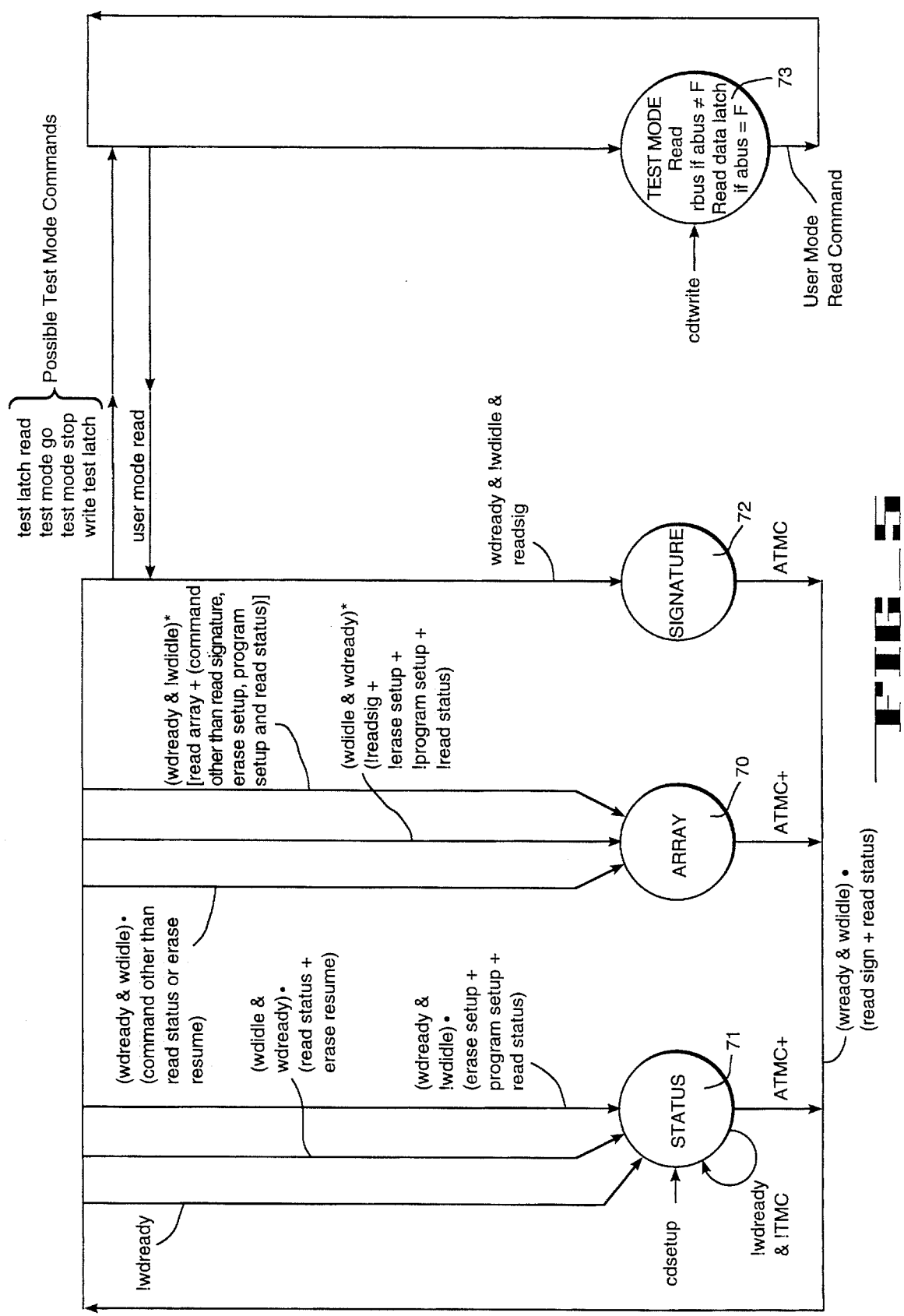
FIG_5

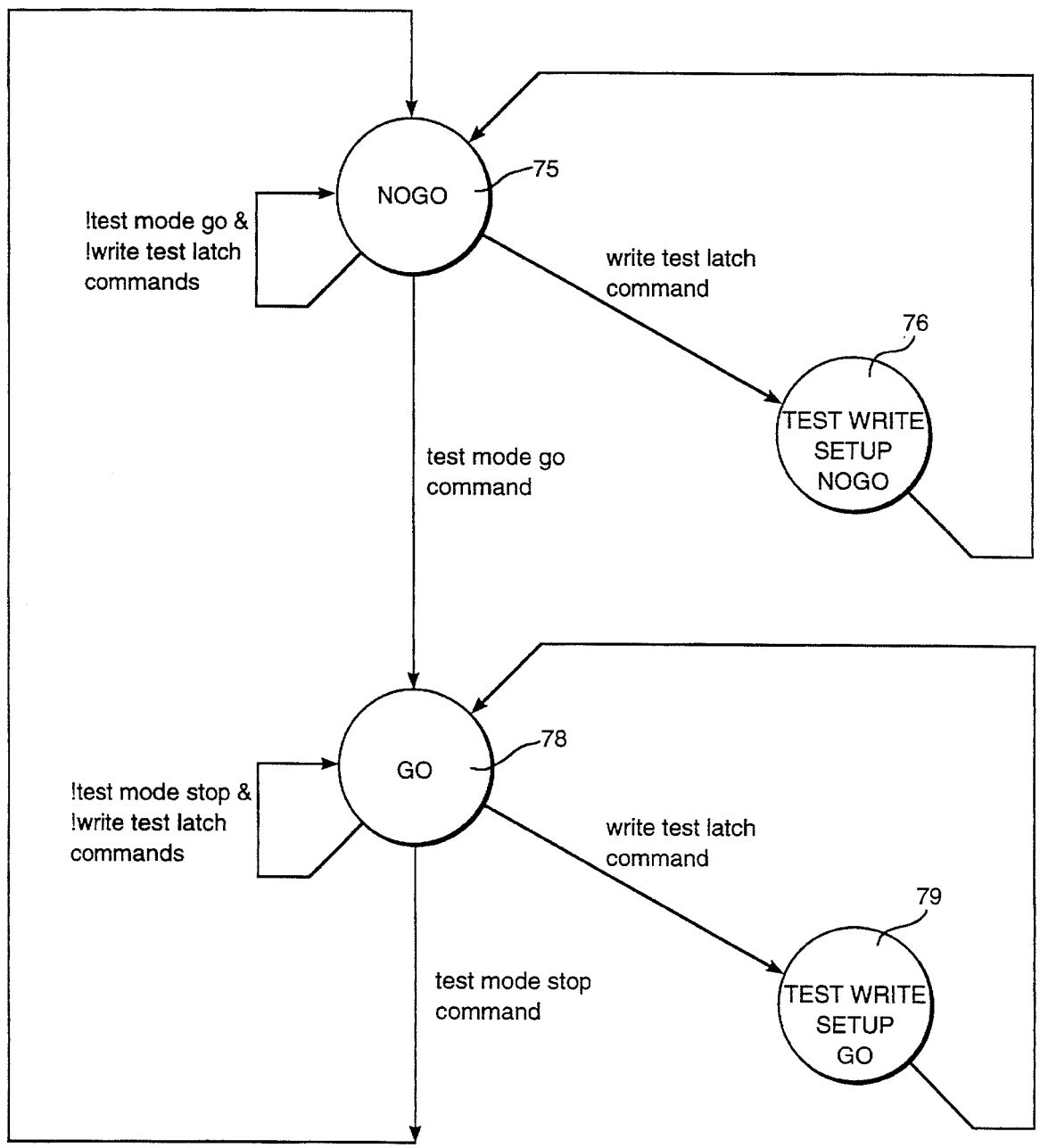
FIG_6

COMMAND INTERFACE BETWEEN USER COMMANDS AND A MEMORY DEVICE

This is a continuation of Ser. No. 07/655,643, filed Feb. 11, 1991, now abandoned.

BACKGROUND OF THE INVENTION

1. Field of the Invention

This invention relates to memory systems and more particularly, to methods and apparatus for controlling the system interface between the system user and the memory.

2. History of the Prior Art

Electrically programmable read only memories (EPROMS) have been used for many different purposes. These memories provide a quick and relatively inexpensive way of furnishing read-only memory. These memories are readily available in arrays up to four megabits. One unfortunate aspect of EPROMs is the difficulty of reprogramming them. In general, an EPROM can only be erased using ultra violet light, which requires removing the EPROM form the system in which the memory is being used. Further, erasure of an EPROM results in erasure of all the data within the memory array of the EPROM.

Because it is often desirable to reprogram read only memory and it is also desirable that this be done without the need to remove the memory from the system, advanced forms of EPROMs have been developed. For example, electrically erasable programmable read only memories (EEPROMs) have been developed which allow the read only memory to be erased at the byte level. This facility allows erasure to be done without removing the memory from the system. It also allows most of the information already in memory to be retained and only the specific information which needs change to be changed. See, for example, U.S. Pat. No. 4,023,158 for a discussion of such EEPROM cells and U.S. Pat. No. 4,266,283 for a discussion of the related circuitry. These memories, however, are always larger physically than are EPROM cells due to the larger cell necessary to implement EEPROM specific functionality. Moreover, they are available only in sizes up to approximately 256K bits.

Recently, a new electrically erasable programmable read only memory called flash EEPROM has been devised. Such a memory array is disclosed in U.S. patent application Ser. No. 667,905, entitled *Low Voltage EEPROM Cell*, Lai et al, filed Nov. 2, 1984, and assigned to the assignee of the present invention. Flash EEPROM may be electrically erased without removing the memory from the system. Flash EEPROM is available in memory arrays up to two megabits. A difficulty with flash EEPROM, however, is that it operates by applying a high voltage to the source terminals of all of the transistors (cells) within the memory array. Because these source terminals of the cells are all connected by metallic busing in the array, only the entire array may be erased. This requires that the entire array be reprogrammed once it has been erased.

It has been found possible to erase blocks of flash EEPROM by physically separating those blocks during chip layout into groups (blocks) of cells which may be erased together. This reduces the reprogramming effort to some extent but may be used only in a limited manner because the individual blocks of cells must be physically isolated on the silicon in order to allow these blocks to be flash erased separately. The separation requirement significantly increases the size of the silicon chip so that dividing the array into a finer granularity is almost economically impossible. Because large chips cannot be divided into these blocks, a very substantial amount of useful information in memory must be reprogrammed in making any small change in memory.

Thus, even though blocks of flash EEPROM are separated, the reprogramming effort required for flash EEPROM is very extensive. Because of this, there are a great number of chances for one programming flash EEPROM to inadvertently provide incorrect commands to the chip. Of course, such commands may have no effect on the operation of the circuitry or a deleterious effect. Initial efforts with flash EEPROM have disclosed that the programming of such circuitry is so complicated that it is desirable to limit the ability of a programmer to provide programs which may adversely affect the flash EEPROM.

SUMMARY OF THE INVENTION

It is, therefore, an object of the present invention to provide apparatus and methods for limiting the ability of a programmer to provide commands which may adversely affect the memory being programmed or the associated control circuitry.

It is another object of the present invention to provide apparatus to function as an interface between a user and apparatus for programming memory, which apparatus monitors the commands given by a user and intercepts any command which is not specified as acceptable to the apparatus for programming memory.

It is another object of the present invention to provide apparatus to function as an interface between a user and apparatus for programming memory, to provide an interface for controlling information read from the memory, and to provide an interface for system-controlled test apparatus for the memory.

These and other objects of the present invention are realized in a command state machine for control circuitry associated with a memory array which control circuitry includes means for programming and erasing the memory array comprising first state machine logic means for providing control signals for reading the memory array and for initiating operations of the means for programming and erasing the memory array in response to commands, and second state machine logic means for controlling information derived from the memory array, the first and second state machine logic means being adapted to assume predetermined states in response to any invalid command which have no adverse affect on the memory array or the control circuitry.

These and other objects and features of the invention will be better understood by reference to the detailed description which follows taken together with the drawings in which like elements are referred to by like designations throughout the several views.

BRIEF DESCRIPTION OF THE DRAWINGS

FIG. 2 is a block diagram illustrating a command state machine for providing an interface in accordance with the present invention between a user and apparatus for programming flash EEPROM.

FIG. 3 is a list of the states which may be entered by the command state machine and the output signals produced by those states.

FIG. 4 is a state diagram illustrating the operation of a portion of the command state machine illustrated in FIG. 2.

FIG. 5 is another state diagram illustrating the operation of a second portion of the command state machine illustrated in FIG. 2.

FIG. 6 is a third state diagram illustrating the operation of a third portion of the command state machine illustrated in FIG. 2.

NOTATION AND NOMENCLATURE

Figure 1:
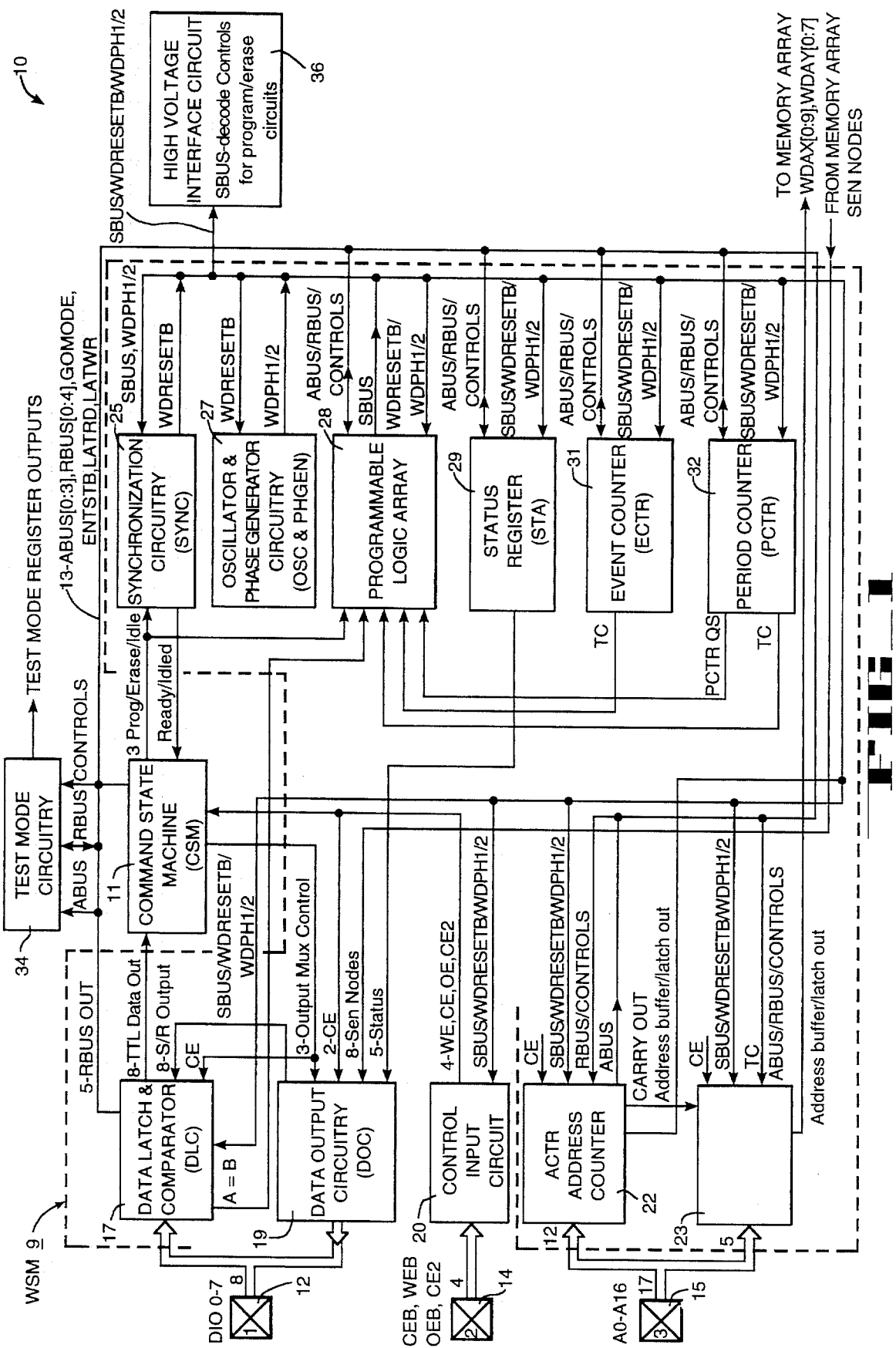
FIG. 1 is a block diagram illustrating a memory system constructed in accordance with the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to method steps for operating a computer in processing electrical or other (e.g. mechanical, chemical) physical signals to generate other desired physical signals.

With respect to particular designations used in the specification, it should be understood that when referring to signals WDREADY and !WDREADY refer to different values of the same signal. Moreover, the indication !<COMMAND> means any other command except <COMMAND>.

DETAILED DESCRIPTION OF THE INVENTION

Referring now to FIG. 1, a block diagram of a control system 10 for a memory system utilizing the present invention is illustrated. Although the preferred embodiment of the invention is utilized for controlling the programming and reprogramming of flash EEPROM, its use might certainly be extended to other forms of programmable long term memory in which the elimination of command errors is highly desirable.

The phrase "command" is used throughout this description as commonly understood in the Flash art. That is to say, "command" means the application of digital signals to the data pins or data terminals of the memory device while control terminals are held at appropriate levels. Thus, it will be understood that the phrase "READ ARRAY command," or a similar phrase, refers to a unique combination of digital signals applied to the memory device's data terminals that represent permissible operations by the memory device. Invalid commands refer to combinations of digital signals applied to the data terminals that do not represent one the permissible operations. Given that the memory systems 10 includes eight data terminals, the number of invalid commands exceeds the number of valid commands. Of the 256 commands possible using eight data terminals a small subset of these (only 14 valid commands are described in the description that follows) are valid. Thus, there are a great number of possible invalid commands that the command state machine of the present invention recognizes and prevents from adversely effecting the memory system 10.

The system 10 illustrated in FIG. 1 includes a command state machine 11 which is the subject of the present invention. The command state machine 11 functions as the interface between an external user and the memory system. The system 10 receives input data on and controls the transfer of output data to a number of terminals DIO 0–7 represented by the box 12 to the upper left in the figure. The system 10 receives control signals at a number of terminals represented by a box 14 to the center left in the figure. These signals are buffered versions of chip enable (CEB), write enable (WEB), output enable (OEB), and a signal (CE2) which indicates that a low power state of the system is desired. The buffered chip enable (CEB) and write enable (WEB) signals are clock inputs to the circuitry of the present invention. The system 10 receives addresses at terminals A0–A16 represented by a box 15 to the lower left in the figure.

The data signals received at the terminals DIO 0–7 are transferred to WDLC circuitry 17. The circuitry 17 includes data latches, comparators, input/output (RBUS) drivers, and input buffers. When the user desires to program the memory, the data is stored in the data latches of the circuit 17 for use by the rest of the write state machine 9, which controls the actual write operations. The operation of these data latches are controlled by the command state machine 11 of the present invention. The comparators of the circuit 17 are used to compare the contents of the data latches against the contents of the memory array being programmed to determine when programming has been completed. The input/output (RBUS) drivers are test mode register bus drivers which drive the data into the system in the test mode of the memory system. The input buffers are the direct in-line inputs which translate from a TTL input level outside of the system to a CMOS level within the system. Data furnished to the WDLC circuit 17 may be placed on an R (input/output) bus to test module latches or directed to the write state machine under control of the command state machine 11.

Output signals from the system 10 are directed to the terminals DIO 0–7 through an output circuit 19. The circuit 19 includes drain bias circuitry, sense amplifiers, output drivers, and an output multiplexor. The drain bias circuitry and sense amplifiers convert the current levels furnished by the memory array into voltages that can be sent outside the system 10 in digital form. The output drivers drive the signals on the pins to circuitry external to the system 10. The output multiplexor determines under control of the command state machine 11 which signals are to be sent to the output drivers for transfer to the external circuitry. The possible outputs include the output of the sense amplifiers of the memory array, the output of the test mode registers, signatures indicating the particular chip being operated, and the output of status registers, among others.

The control signals at the terminals indicated by box 14 are transferred to a control input circuit 20. The circuit 20 includes input level shifters, input level buffers and their logic, test mode enable circuits, and similar circuitry for utilizing the control signals within the system 10. The control signals from the circuit 20 are transferred to the command state machine 11 and the output circuit 19.

Addresses appearing on address terminals A0–A16 are transferred to two circuits 22 and 23 which include address latches, buffers, address counters, and circuitry used for addressing the memory array. Addresses at the address latches are transferred for use on the address bus (A bus).

To the right of the command state machine 11 is a synchronization circuit 25 which accomplishes the synchronization of the asynchronous control signals moving between the command state machine 11 and the write state machine 9. The synchronization circuit 25 also includes circuitry for turning on and off clock signals which are generated internally to the write state machine 9 by the oscillator of circuitry 27. This is desirable because the write state machine 9 is used infrequently, and it is desirable to limit the power used by the system 10 when the write state machine 9 is not in use.

The oscillator and phase generator circuitry 27 is located below the synchronization circuitry 25 in FIG. 1. The circuitry 27 includes, as its name suggests, an oscillator and phase generation circuits for generating the two clocks which are used within the write state machine 9.

A circuit 28 is a state machine and the drivers and switching circuitry necessary to control the operation of the rest of the write state machine 9. It executes the various functions necessary to control the actual programming and erasing of the associated memory array.

A status register circuit 29 below the write state machine 9 in FIG. 1 allows a user to poll the write state machine 9 in order to determine its status; the command state machine 11 allows the status register 29 to be interrogated while the write state machine 9 is busy with either erasing or programming. This is the only other operation which may be carried out during these operations.

Circuits 31 and 32 below the status register circuit 29 include counters for determining the number of pulses applied to the memory array in a particular program or erase attempt and the width of the high voltage pulse applied to the memory array for either a program or erase operation.

Above the command state machine 11 in FIG. 1 is test mode circuitry 34 which includes various test mode registers. These registers may be read and written by the system through the command state machine 11 using the R bus and the A bus. To the right in FIG. 1 is a high voltage interface circuit 36 which applies the signals for programming and erasing the associated memory array under control of the write state machine 9. An S bus, the system state bus, provides signals to the high voltage interface circuit 36 as well as to a number of the other circuits described above.

FIG. 2 is a block diagram of the command state machine 11. From the following description of the functioning of the various state machines logics of the command state machine 11, one of ordinary skill in the art will understand that the command state machine logic may be implemented using a combination of logic gates or firmware, i.e. micro code stored in a memory device. The particular type of hardware used to realize the command state machine 11 is not relevant to the present invention. The command state machine 11 includes three main portions: an input section 40, a state machine logic section 41, and an output section 42. The state machine logic section 41 includes user state machine logic 43 which is used for programming and erasing the memory array by means of the write state machine 9 and for polling the status register 29 to determine the condition of the write state machine 9. The state machine logic section 41 also includes outmux state machine logic 46 which controls the operation of the output multiplexor with data output circuitry 19 of FIG. 1 to determine the information transfer out of the system 10. The final portion of the state machine logic section 41 is test state machine logic 45 which controls all of the test modes of the system 10 through the test mode circuitry 34.

In order to operate the system 10, the user is provided a set of eight commands which may be executed by the user state machine logic 43. These commands are: ERASE SETUP, PROGRAM SETUP, CLEAR STATUS REGISTER, READ STATUS REGISTER, READ SIGNATURE, ERASE SUSPEND, ERASE RESUME, and READ ARRAY. Two commands, the ERASE SETUP command followed by the ERASE RESUME command, are required to erase a program stored in a particular block of the associated memory array. In a similar manner, two commands, PROGRAM SETUP followed by the data and address to be written, are required to program or reprogram a particular block of the associated memory array. The CLEAR STATUS REGISTER and READ STATUS REGISTER commands are used to clear and to determine the condition of the write state machine. The READ SIGNATURE command is used to transfer signals outside of the system 10, which signals indicate that the system 10 is a particular piece of hardware and the name of its manufacturer. The ERASE SUSPEND command is used in conjuction with the ERASE RESUME command to allow the time consuming erasure of a portion of the memory array to be suspended while particular operations of the system are carried out. Finally, the READ ARRAY command allows the data stored in the memory array to be read. These are the only commands that may be executed by the user.

Not available to the user are a set of test commands which include TEST LATCH READ, USER MODE READS, TEST MODE GO, TEST MODE STOP, and WRITE TEST LATCH. In general, these commands are directed to the test state machine logic 45 and the outmux state machine logic 46 and involve processes for testing the setup and condition of the hardware. The commands utilize test latches of the test mode circuit 34 to accomplish the testing of the memory array.

In addition to the READ ARRAY command, a number of signals are generated in response to the operations of the user state machine logic 43 and the test state machine logic 45 which operate the outmux state machine logic 46 to furnish the appropriate output from the system 10 and the associated memory array for the particular operation conducted. These will be discussed later in this specification.

To the left of the input circuit 40 in FIG. 2 are illustrated the input signals to which the command state machine 11 responds. The CDWEB signal is the write enable control signal from the control input circuit 20 of FIG. 1. This signal causes the generation of a number of clocks internal to the command state machine 11 by a non-overlapping clock generator 47. A WDDIN [7:0] signal is a buffered version of the data input from the data terminals 12 of FIG. 1. The user commands are transferred via this input to a logic section 44 of the input 40 and to the state machine logic section 41. A PDPWRDN signal directed to the logic section 44 is a power down signal which causes the system 10 to assume a low power dissipation state. A CDENTSTB signal to the logic section 44 is an enable signal from the control input circuit 20 of FIG. 1 for accessing the test mode registers within test mode circuitry 34.

CDSETUP and CDTWRITE are internal signals generated by the command state machine 11 in response to the user commands which indicate the process being run. During the erase and program setup operations, the CDSETUP signal is fed back to indicate that the first portion of the particular operation has been executed and the command state machine 11 is waiting for the second command of the operation. WDREADY and WDIDLE are signals generated by the write state machine 9 and used for synchronizing the output signals of the command state machine 11 and the write state machine 9 across the interface between those circuits. Signals on the A bus and chip enable signal (CDCEB), output enable signal (CDOEB), write enable signal (CDWE1), and write enable bar signal (CDWEB) are also furnished to a logic circuit 48 within the output circuit 42 to control the timing and use of the various operations.

Responding to these input signals, the mode logic 48 of the command state machine 11 provides CDALE and CDDLE signals which are control signals for the address and data latches within the write state machine 9. The mode logic 48 also produces CDABUSON (A bus on), CDLATRB (test latch read), CDLATWB (test latch write), CDGOMODE (test mode go), and CDTWRITE (test mode write) signals, all for operating the test mode latches. A set of latches 49 in the output section 42 provide output signals CDERASE (erase) CDPROG (program), CDSUSP (suspend), and CDSTATRS (status register reset) which are sent to the write state machine 9 to control its operation.

The various commands and signals referred to above are transferred to the command state machine 11 at its input terminals. These signals and commands affect the logic circuitry of the three state machine logic sections 43, 45, and 46 in a manner to be described hereinafter to produce particular states and to generate the output signals described. Each of the input commands transferred to the state machine logic section 41 causes a state to be latched in a number of state latches in within the present state latch circuitry 50 in the output section 42. Three present state latches referred to as NDLAT1, NDLAT2, and NDLAT3 in the present state latch circuitry 50 latch state for the user commands; two present state latches CDOUTMX1 and CDOUTMX0 latch states for the outmux state machine logic 46; and two present state latches CDGOMODE and CDTWRITE latch state for the test mode state machine logic 45. Some of these commands affect a single one of the state machine logic sections 43, 45, and 46, while other commands affect two of the state machine logic sections 43, 45, and 46.

FIG. 3 describes the states provided in response to the various input signals and those commands which may legitimately be furnished to the state machine logic section 41. For each of the states listed under the "User States," the user state machine logic 43 sets the latches internal to user state machines logic 43 listed to the logical state listed in the second column to provide the signals on the output lines from the output circuit 42 as indicate in the third column, on the right hand side of FIG. 2. The logical states of the latches in the present state latch circuitry 50 are read in the following manner. A zero in the first column means that the NDLAT1 latch is not set while a one means that the latch is set. The same indications in the second column refer in the same manner to the state of the NDLAT2 latch while those indications in the third column refer to the state of the NDLAT3 latch. In a similar manner, the states which may be entered by the outmux state machine logic 6 are listed in the left column. The first number of a middle column defines the state of the CDOUTMX1 latch in circuit 50 while the second number defines the state of the CDOUTMX0 latch within the present state latch circuitry 50 during each particular state of the command state machine logic 46. The test states which may be entered are also indicated in FIG. 3 in a similar manner to the left. The first column of the internal states indicates the state of the CDGOMODE latch while the second column indicates the state of the CDTWRITE latch.

These latch states in turn produce output signals as defined in the output column to the right in FIG. 3. For example, the user states referred to by the latch conditions in the "Internal States" column provide the signals indicated in the five columns to the right. A one in a position indicates the signal is provided; a zero indicates no signal is provided. The first position (at the left) indicates the CDERASE signal, the second position indicates the CDPROG signal, the third position indicates the CDSTATRS signal, the fourth position indicates the CDSUSP signal, and the fifth position (at the right) indicates the CDSETUP signal.

Each of the states generated by the outmux state machine logic 46 is indicated by a combination of the bits CDOUTMX0, CDOUTMX1, and CDOUTMX2. The ARRAY, SIGNATURE, and STATUS states 70, 72 and 71 are indicated by the given combinations of CDOUTMX0 and CDOUTMX1 regardless of the state of CDOUTMX2.

With the number of output pins available to the system 10, there are a very large number of output combinations which might be possible. Some of these combinations are undefined. It is undesirable that such output combinations be able to affect the system 10 because they may cause possible undesirable operations in the write state machine or the memory array, for example. The present invention eliminates the possibility of generating unwanted, undesirable, and unknown combinations of control signals which might create a defect in the operation of the system 10 and the associated memory array.

FIGS. 4, 5 and 6 are state diagrams for each of the state machines within the STATE MACHINE LOGIC SECTION 41. Each bubble, or circle, in FIGS. 4, 5 and 6 represents a state of the particular state machine being described. The name of each state is indicated within the bubble, and corresponds to a state name described in FIG. 3. The combination of relevant signals and relevant commands that cause a state machine to branch from one state to another are generally indicated in text beside the branch, which is represented as line with an arrow. Inactive signals are preceded by an explanation point "!" Only those signals that cause a state machine to branch from one state to another are indicated next to a branch. Thus, it will be understood that signals and commands NOT indicated next to a branch do not effect the state machine's decision to branch at the point in the operation of the stte machine. (This convention is not followed in FIG. 5 as will be explained later.) It will be understood, unless otherwise indicated, that a state machine branches from a state regardless of the input signals or commands when no text is next to a branch.

FIG. 4 is a state diagram indicating the response of the user state machine logic 43 to various combinations of input signals and commands. When the system 10 is turned on, the user state machine logic 43 comes up in the NORMAL READ state. In order to leave this state 60, it is necessary for the user state machine logic 43 to receive a STATUS CLEAR command, a PROGRAM SETUP command, or an ERASE SETUP command. Any other command will cause the user state machine to simply remain in the normal read state 60 as is shown by the input commands pointing to state 60. As may be seen, any command given other than these three valid commands causes the user state machine logic 43 to assume the normal read state 60. Consequently, any command which a user might generate through error will automatically move the user state machine logic 43 to state 60. In the normal read state 60, none of the latches NDLAT1-3 are set. Consequently, none of the output signals CDERASE, CDPROG, CDSTATRS, CDSUSP, or CDSETUP are generated.

On the other hand, if one of the valid commands mentioned above is received, the user state machine logic 43 will move from the normal read state 60 to a state depending on the command. For example, if the user state machine 43 receives the STATUS CLEAR command while in the normal read state 60, the user state machine logic 43 jumps to the status clear state 61. In this state 61, the user state machine logic 43 sets the single latch NDLAT3, and the single output signal CDSTATRS is produced which is sent to clear the status register 29. In the status clear state 61, any command other than one of the valid STATUS CLEAR, PROGRAM SETUP, and ERASE SETUP commands takes the user state machine logic 43 to the normal read state 60. For example, the ERASE SUSPEND command is only valid after the ERASE SETUP command has been given; consequently, if this command is given in the status clear state 61 of the user state machine logic 43, the user state machine logic 43 moves to the normal read state 60.

This method by which the user state machine logic 43 moves to the normal read state 60 when any command is received which is invalid at that point in the operation of the command state machine 11 is a portion of the method by which the command state machine 11 assures that no invalid output conditions may be generated which might in some way affect the associated memory array or other associated circuitry.

If the PROGRAM SETUP command (a valid command) is received in the normal read or status clear states 60 and 61 then the user state machine logic 43 moves to the program setup state 62. As may be seen in FIG. 3, this sets the latch NDLAT2 and generates the output signal CDSETUP. The signal CDSETUP is transferred back to the input section 40 of the command state machine 11 to indicate that the WRITE STATE MACHINE 9 is in the middle of the programming the memory array and the next inputs to the command state machine 11 are to be interpreted as program address and program data, not as a command.

After receiving this signal, the user state machine logic 43 must receive an address and data for programming the memory array in order to move to the PROGRAM ACTIVE state. Because of the CDSETUP signal and the program setup state 62, only an address and data for programming the memory array are valid; and any data appearing at the terminals DIO 0-7 is used for programming the memory array.

When data is received in the program setup state at block 62, the user state machine logic 43 moves to the PROGRAM ACTIVE state 63, setting latches NDLAT2 and NDLAT3 and generating a CDPROG signal which is transferred to the write state machine 9. This initiates programming of the memory array under control of the write state machine 9.

While the write state machine 9 is programming the memory array, it returns a !WDREADY signal to the command state machine 11 which indicates that no commands should affect the user state machine 43 logic until programming is completed. During this period only the READ STATUS command to the command state machine 11 may affect the outmux state machine logic 46 to sense the status of the write state machine 9.

When the write state machine 9 has finished programming the memory array, it returns a WDREADY signal, and the operation of the user state machine logic 43 awaits the next command. On receipt of the next command, the user state machine logic 43 will advance to the status clear state 61 (if a CLEAR STATUS command is received), to the program setup state (if a PROGRAM SETUP command is received), to the erase setup state (if an ERASE SETUP command is received), or to the normal read state (if any other command is received).

If the ERASE SETUP command is given at any time when it is valid, the operation moves to an erase setup state shown by a block 64. The erase setup state sets the latch NDLAT1 and generates a CDSETUP signal. As with the PROGRAM SETUP state, this signal indicates to the command state machine 11 that the machine is in the middle of a setup operation in which commands other than those carrying out the setup operation are invalid. In the ERASE SETUP state, the only valid command for the user state machine logic 43 is an ERASE RESUME command which moves the operation to the ERASE ACTIVE state at a block 65.

If an invalid command is received in the ERASE SETUP state, the operation moves to an ERASE BOTCHED state at block 66 in which all of the latches NDLAT1-3 are set. This generates both CDERASE and CDPROG signals which are transferred to the write state machine 9. The write state machine 9 sees these signals as indicating that the ERASE RESUME command has not been received and the attempt to erase has been botched. The write state machine 9 sets an error bit in the status register 29. Until this is done, the write state machine 9 sends back a !WDREADY signal, and the operation stays in the ERASE BOTCHED state. When the command error indication has been stored in the status register 29, the write state machine 9 returns a WDREADY signal, and the operation awaits the next command.

If when in the ERASE SETUP state an ERASE RESUME command is received, the operation moves to the ERASE ACTIVE state at block 65. This state sets the NDLAT1 and NDLAT3 latches and generates a CDERASE signal which is transferred to the write state machine 9. This signal initiates an erase operation under control of the write state machine 9. The write state machine 9 generates a !WDREADY signal to the user state machine logic 43 during the time of the erase operation so that any command other than ERASE SUSPEND is ignored, and the operation continues in the ERASE ACTIVE state. When the erasure is complete, the write state machine 9 returns a WDREADY signal; and the operation awaits the receipt of another command.

The erasure of a full block of the memory array takes a significant amount of time. Consequently, it is sometimes desirable to interrupt the process to execute other commands which do not interfere with the erase operation. If an ERASE SUSPEND command is received in the ERASE ACTIVE state while the write state machine is providing a !WDREADY signal, the operation moves to the ERASE SUSPEND state. This state sets the NDLAT1 and NDLAT2 latches and generates CDERASE and CDSUSP signals to the write state machine 9. In this condition, when !DREADY (the erase operation is not complete) or an WDIDLE signal is returned, the ERASE RESUME command moves the user state machine logic 43 back to the erase active state 63. The user state machine logic 43 remains in the erase suspend state 67 until an ERASE RESUME command is received unless the write state machine 9 indicates that the suspend occurred just as the erase operation was completed. The write state machine 9 does so by returning both WDREADY and !WDIDLE signals. The user state machine logic 43 responds by moving to the NORMAL READ state 60.

FIG. 5 is a state diagram illustrating the operation of the outmux state machine logic 45 of the command state. When] machine 11. Given the number of conditions that can cause outmux state machine logic 46 to branch between states 70, 71 and 72 not all conditions that cause the logic 46 to branch out of states 70, 71 and 72 are indicated beneath the states 70, 71 and 72. It should therefore be understood that conditions that cause the logic 46 to enter one state will, should they become true during a second state, cause logic 46 to exit the second state. For example, the logic 46 enters state 71 in response to !wdready, thus it will be understood the !wdready causes logic 46 to branch out of states 70 and 72 and to state 71. When the system 10 is activated, the operation of the outmux state machine logic 43 comes up in an array state 70 in which the multiplexor of the [circuit] data output circuitry 19 of FIG. 1 is activated to transfer data from the associated memory array. In the array state 70, neither of the latches CDOUTMX0–1 is set; and no output signal is produced.

If any test mode command is received during ARRAY state 70, during the status state 71, or during the SIGNATURE state 72, the outmux state machine logic 46 will move to an TEST MODE state 73. This is indicated in FIG. 5 by the notation "ATMC" below states 71, 70 and 72, which represents "Any Test Mode Command". In state 72 the multiplexor of the data output circuitry 19 usually is set to allow reading the output of the results of the test mode operations. This operation utilizes the R bus (the input/output bus) which connects to the test mode registers. To determine whether the results of the test mode operations or a data latch are to be sensed, the address on the A bus is sensed. If the address on the A bus is other than hexidecimal F, then the test mode results are read. If the address on the A bus is hexidecimal F, then a data latch is read instead. When in the TEST MODE state 73, only the USER MODE READ command will transfer the outmux state machine logic 46 to one of the user states (status 71, array 70 or signature 72).

For other than one of the test mode commands, the state of the outmux state machine logic 46 depends on the condition of the write state machine 9. When the system 10 starts with the outmux state machine logic 46 in the array state 70, the write state machine 9 is not programming or erasing and is, consequently, returning a WDREADY signal. If the operation of the write state machine 9 is not suspended so that a !WDIDLE signal is returned, then the READ SIGNATURE command will take the outmux state machine logic 46 to the SIGNATURE state 72 and a READ STATUS command will move the outmux state machine logic 46 to the status state 71. In addition to these straight forward operations, the ERASE SETUP and PROGRAM SETUP commands move the outmux state machine logic 46 to the status state 71 because when the write state machine 9 begins programming or erasing, a status read is the only safe operation which may be accomplished. Once the write state machine 9 is programming or erasing and is, consequently, returning a !WDREADY signal with the outmux state machine logic 46 in the status state 71, any command which is not a test mode command causes the outmux state machine logic 46 to remain in the status state 71. This is indicated in FIG. 5 by a loop from state 71 back to state 71, accompanied by the notation "!wdready & !TMC." The notation "!TMC" means any command that is not a test mode command. Status state 71 is the only valid state of the outmux state machine logic 46 during these operations by the write state machine 9. In this state 71, the CDOUTMX1 latch is set and the status of the system 10 is polled.

On the other hand, if the write state machine 9 is not programming or erasing so that a WDREADY signal is being returned, the outmux state machine logic 46 moves to the status state 71 if the WDIDLE signal is returned indicating that operation of the array is suspended and a READ STATUS or ERASE RESUME command has been received. This is indicated in FIG. 5 by the notation "(wdidle & wdready)*(read status+erase resume)" next to one of the branches into state 71. The reason for moving to the STATUS state 71 is obvious in the case of a READ STATUS command. However, in the ERASE RESUME command case, the status state 71 is the only state which may be entered since the write state machine 9 will then be engaged in erasing the memory array. Thus, as with the user state machine logic 43, the outmux state machine logic 46 returns the state to a condition in which no output other than those expected can be executed even though erroneous commands are presented.

If the write state machine 9 is not programming or erasing so that a WDREADY signal is being returned, and the WDIDLE signal is returned indicating that the erase of the array is suspended, then the outmux state machine logic 46 moves to the array state 70 if a command other than READ STATUS or ERASE RESUME is received. This is indicated in FIG. 5 by the notation "(wdready & wdidle)*(command other than Read Status or Erase Resume)" next to one of the branches into state 70. Under these conditions, the transfer of data read from the memory array by the multiplexor controlled by the outmux state machine logic 46 is a safe operation.

In a similar manner, the outmux state machine logic 46 moves to the array state 70 if the signals WDREADY (the write state machine 9 is not programming or erasing) and !WDIDLE (the write state machine 9 is not suspended) are present when the command is READ ARRAY or anything other than READ SIGNATURE, ERASE SETUP, PROGRAM SETUP, or READ STATUS. Thus, the outmux state machine logic 46 moves to the array state 70 whenever the write state machine 9 is not suspended but not programming or erasing and an invalid command is received. This is indicated in FIG. 5 by the notation "(wdready & wdidle)*(Read Array or command other than Read Signature, Erase Setup, Program Setup and Read Status)" next to one of the branches into state 70.

Thus, as with the user state machine logic 43, the outmux state machine logic 46 returns to a state in which no command can affect the system 10 adversely. When the write state machine 9 is programming or erasing, any command takes the outmux state machine logic 46 to the status state 71. This is indicated in FIG. 5 by the notation "wdready" next to one of the branches into state 71. If the write state machine 9 is not programming or erasing, ERASE SETUP, PROGRAM SETUP, and READ STATUS commands all take the outmux state machine logic 46 to the status state 71. If the operation of the write state machine 9 is suspended during an erase operation, the READ STATUS and ERASE RESUME commands return the outmux state machine logic 46 to the safe status state 71 while other commands move the operation to the array state 70 in which the array may be read during the suspension of the erase operation. Finally, when the write state machine 9 is not programming or erasing and the erase operation is not suspended, the READ ARRAY command and any invalid command will take the outmux state machine logic 46 to the array state 70 in which only array reads are possible.

Consequently, the operations of the two state machine logic sections 43 and 46 are linked so that while the write state machine 9 is erasing or programming the memory, the outmux state machine logic 46 may respond to no invalid commands or cause the transfer of invalid information. In this way, along with those conditions set up and mentioned above, the elimination of the possibility of invalid commands being sent from the command state machine 11 to the write state machine 9 is attained, even though the user may give invalid commands to the system 10.

FIG. 6 illustrates the operation of the test state machine logic 45 of FIG. 2. The test state machine logic 45 powers up in the nogo state 75. In the nogo state 75, a WRITE TEST LATCH command moves the test state machine logic 45 to the test write setup nogo state 76. A write of a test address and data advances the test state machine logic 45 back to the nogo state 75. This loop of operation (nogo state 75 to test write setup nogo state 76) is usually completed a number of times before all of the test latches have been set and the set up is completed. If, in the nogo state 75, neither the TEST WRITE SETUP command nor the TEST MODE GO command is received, the operation simply recycles through the nogo state.

When the test which has been set up is ready to be run, a TEST MODE GO command is given; and the state of test state machine logic 45 changes from NOGO state 75 to GO state 78. The go state 78 sets the CDGOMODE latch and causes the particular test mode to be run. While in the go state, the test state machine logic 45 may accept a WRITE TEST LATCH command in response to which it moves to the test write setup go state 79. After the latch is written, the test state machine logic 45 returns to the go state 78 and executes any test mode that has been set up previously. The test state machine logic 45 remains in the go state 78 until a TEST MODE STOP command is received at which time the test state machine logic 45 returns to the nogo state.

As was explained above, the various commands used to operate the test state machine logic 45 also affect the outmux state machine logic 46 to control the multiplexor in a manner that the results of the test mode operation may be assessed.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A command interface in a memory system for interfacing between an external user and a memory array included in the memory system, the external user issuing commands to the memory system via a multiplicity of terminals, valid commands from the user including a program command and an erase command, the memory system including a write state machine for controlling programming and erasure of the memory array, the write state machine generating a ready signal and an idle signal, the ready signal having an active state indicating that the write state machine is not busy and having an inactive state indicating that the write state machine is busy, the idle signal having an active state indicating that the write state machine has suspended erasure, and having an inactive state, the write state machine including a status register for indicating a status of the write state machine, the memory system including output circuitry for coupling signals within the memory system to the multiplicity of terminals, the command interface including:

a) a user state machine for controlling the operation of the write state machine via control signals including a program control signal and an erase control signal, the user state machine analyzing a command received via the terminals and bringing the program control signal active if the command is the program command, the user state machine bringing the erase control signal active if the command is the erase command, the user state machine preventing adverse effects on write state machine if the command is an invalid command by bringing the program control signal inactive and bringing the erase control signal inactive.

2. The command interface of claim 1 further comprising:

an outmux state machine for controlling information output to the external user by the output circuitry, the outmux state machine analyzing the command and the ready and idle signals, if the ready signal is inactive the outmux state machine generating first output control signals to prevent the coupling of signals to the output circuitry regardless of the command, if the ready signal is active, if the idle signal is active and the command represents a request for information from the memory array the outmux state machine generating second output control signals to couple data from the memory array to the output circuitry.

3. The command interface of claim 1 wherein the memory system includes signature signals representing signature information about the memory system and wherein if ready signal is active, the idle signal is inactive and the command is a command to output the signature information the outmux state machine responding by generating third output control signals to couple the signature signals to the output circuitry.

4. The command interface of claim 1 wherein the memory system further including a test mode latch for storing a test mode go bit, the test mode go bit having an active state enabling a test mode to begin execution and having an inactive state preventing the test mode from beginning execution and wherein the command interface further comprises:

a test state machine for controlling the test mode latch, the test state machine being coupled to the terminals and the write state machine, the test state machine analyzing the command to determine if the command is a command to begin test mode execution, the test state machine responding by bringing active the test mode go bit.

5. The command interface of claim 1 further comprising:

a) a first latch having an input coupled to the erase control signal and an output coupled to the write state machine; and b) a second latch having an input coupled to the program control signal and an output coupled to the write state machine.

6. The command interface of claim 1 wherein the memory array is an array of electrically erasable memory cells.

7. The command interface of claim 1 wherein the memory array is an array of flash memory cells.

8. A flash memory system including:

a) an array of flash memory cells;

b) terminals coupling command signals from an external user to the flash memory system;

c) a write state machine for controlling programming and erasure of the array and generating a ready signal and an idle signal, the ready signal having an active state indicating that the write state machine is not busy and the ready signal having an inactive state indicating that the write state machine is busy, the idle signal having an active state indicating that the write state machine has suspended erasure, and the idle signal having an inactive state, the write state machine including a status register for indicating a status of the write state machine;

d) output circuitry for coupling signals within the flash memory system to the terminals;

e) a command interface for analyzing the command signals and controlling the operation of the write state machine and the output circuitry, the command interface including:

1) a user state machine analyzing the command signals received via the terminals to determine if they represent valid commands, valid commands including a program command and an erase command, the user state machine bringing active a program control signal if the command signals represent the program command, the user state machine bringing active an erase control signal if the command signals represent the erase command, the user state machine preventing adverse effects on write state machine if the command signals represent an invalid command by bringing the program control signal to an inactive state and bringing the erase control signal to an inactive state.

9. The flash memory system of claim 7 wherein the command interface further comprises:

2) an outmux state machine for controlling information output to the external user by controlling the output circuitry, the outmux state machine analyzing the command signals and the ready and idle signals, if the ready signal is inactive the outmux state machine generating first output control signals to prevent the coupling of signals within the flash memory system to the output circuitry regardless of whether the command signals represent a valid command, if the ready signal is active, the idle signal is active and the command signals represent a command to output information from the flash array the outmux state machine responding by generating second control output control signals to couple data from the array to the output circuitry.

10. The flash memory system of claim 9 further comprising:

signature signals representing signature information about the flash memory system; and wherein if the ready signal is active, the idle signal is inactive and the command signals represent a command to output the signature information the outmux state machine responding by generating third output control signals to couple the signature signals to the output circuitry.

11. The flash memory system of claim 8 further comprising:

a test mode latch storing a test mode go bit, the test mode go bit having an active state enabling a test mode to begin and having an inactive state preventing the test mode from beginning; and wherein the command interface further comprises:

a test state machine for controlling the test mode latch, the test state machine being coupled to the terminals and the write state machine, the test state machine analyzing the command signals to determine if they represent a command to begin test mode execution, if so the test state machine bringing active the test mode go bit.

* * * * *

UNITED STATES PATENT AND TRADEMARK OFFICE
CERTIFICATE OF CORRECTION

PATENT NO. : 5,463,757
DATED : October 31, 1995
INVENTOR(S) : Fandrich et al.

It is certified that error appears in the above-identified patent and that said Letters Patent is hereby corrected as shown below:

In column the Title page at [75] delete "Kreiffels" and insert --Kreifels--

Signed and Sealed this

Fifteenth Day of July, 1997

BRUCE LEHMAN

Attest:

Attesting Officer

Commissioner of Patents and Trademarks